United States Patent [19]
Wollnik et al.

[11] Patent Number: 5,644,128
[45] Date of Patent: Jul. 1, 1997

[54] FAST TIMING POSITION SENSITIVE DETECTOR

[75] Inventors: Hermann Wollnik, Fernwald; Christoph Klein, Bad Endbach, both of Germany

[73] Assignee: Ionwerks, Houston, Tex.

[21] Appl. No.: 296,312

[22] Filed: Aug. 25, 1994

[51] Int. Cl.⁶ .............................. H05H 3/00; H01J 47/00
[52] U.S. Cl. ................... 250/251; 250/287; 250/385.1
[58] Field of Search .................... 250/287, 281, 250/385.1, 251; 313/103 CM, 105 CM

[56] References Cited

U.S. PATENT DOCUMENTS

| | | |
|---|---|---|
| 3,904,994 | 9/1975 | Bates et al. ............................ 333/31 R |
| 4,395,636 | 7/1983 | Anger et al. ............................ 250/366 |
| 4,435,642 | 3/1984 | Neugebauer et al. ................. 250/296 |
| 4,454,422 | 6/1984 | Persyk .................................... 250/385.1 |
| 4,870,265 | 9/1989 | Asmussen et al. .................... 250/211 R |
| 4,904,872 | 2/1990 | Grix et al. . | 
| 5,025,144 | 6/1991 | Odom et al. . |
| 5,073,713 | 12/1991 | Smith et al. ........................... 250/287 |
| 5,103,083 | 4/1992 | Reed et al. . |
| 5,208,213 | 5/1993 | Ruby ........................................ 505/1 |
| 5,347,132 | 9/1994 | Holzman et al. ..................... 250/385.1 |

OTHER PUBLICATIONS

Mark B. Williams et al.; *High Resolution Two Dimensional Readout of Microchannel Plates with Large Area Delay Lines*, Feb. 1989, IEEE Transactions on Nuclear Science, vol. 36, No. 1, pp. 227–230.

R. Raffanti, et al.; *High–Resolution Y–axis Readout for Delay–Line Microchannel Anodes*, received Sep. 29, 1992; accepted Jan. 19, 1993; Rev. Sci. Instrum. vol. 64, No. 6, Jun. 1993, pp. 1506–1509.

D. Blavette, et al.; *An Atom Probe for Three–dimensional Tomography; Nature*, vol. 363, Jun. 3, 1993; pp. 432–434.

John A. Shepherd et al.; *Imaging Properties of a Delay Line Readout Using Large Microchannel Plates*; 1991 IEEE; pp. 154–157, no month.

Ch. Klein et al.; *Fast timing position sensitive detectors*; Nuclear Instruments & Methods in Physics Research, Section A, pp. 146–147; Oct. 6, 1993.

*Primary Examiner*—Bruce C. Anderson
*Attorney, Agent, or Firm*—Fulbright & Jaworski L.L.P.

[57] ABSTRACT

A position sensitive fast timing detector for determining time-of-flight mass analysis and position of atomic particles includes a channel plate assembly for detecting the impact of one or more atomic particles a transforming them into one or more electron clouds. The electron cloud then passes through an electron detector which includes a meandric delay line located in front of a back plate. A second meandric delay line may also be utilized, wherein the second delay line is orthogonal with the first delay line. A grid may be placed between the first and second meandric delay lines to reduce cross-talk.

45 Claims, 13 Drawing Sheets

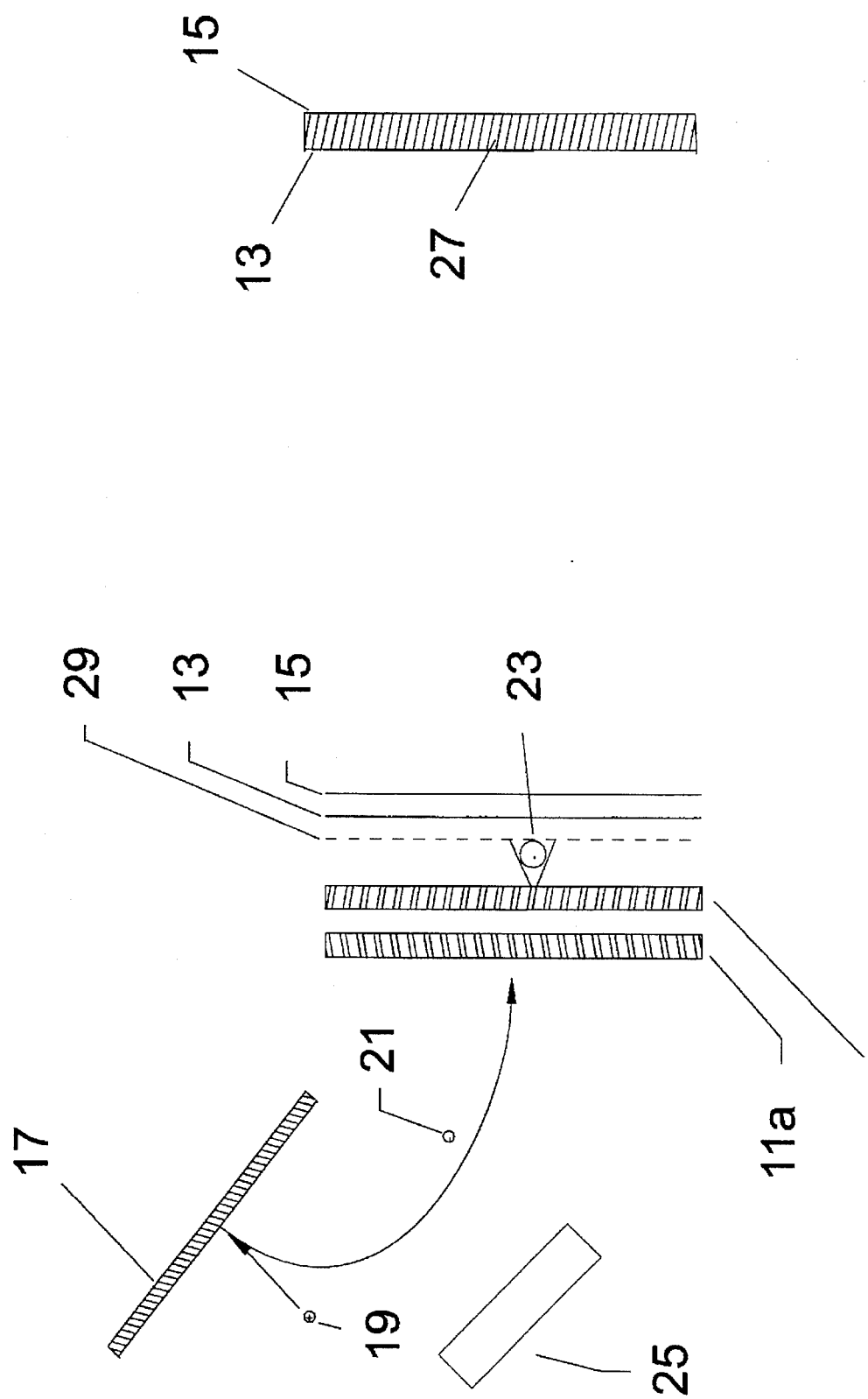

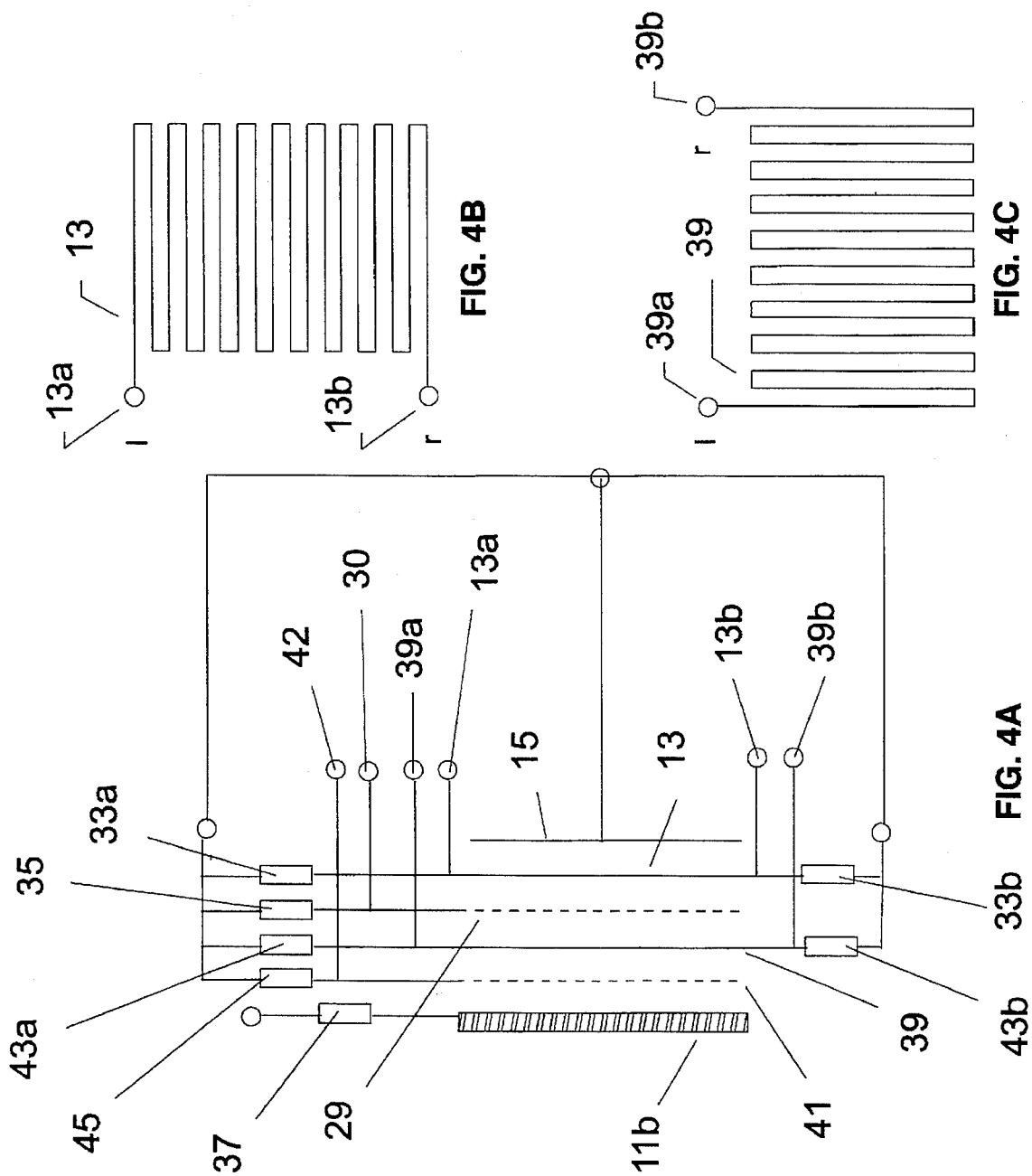

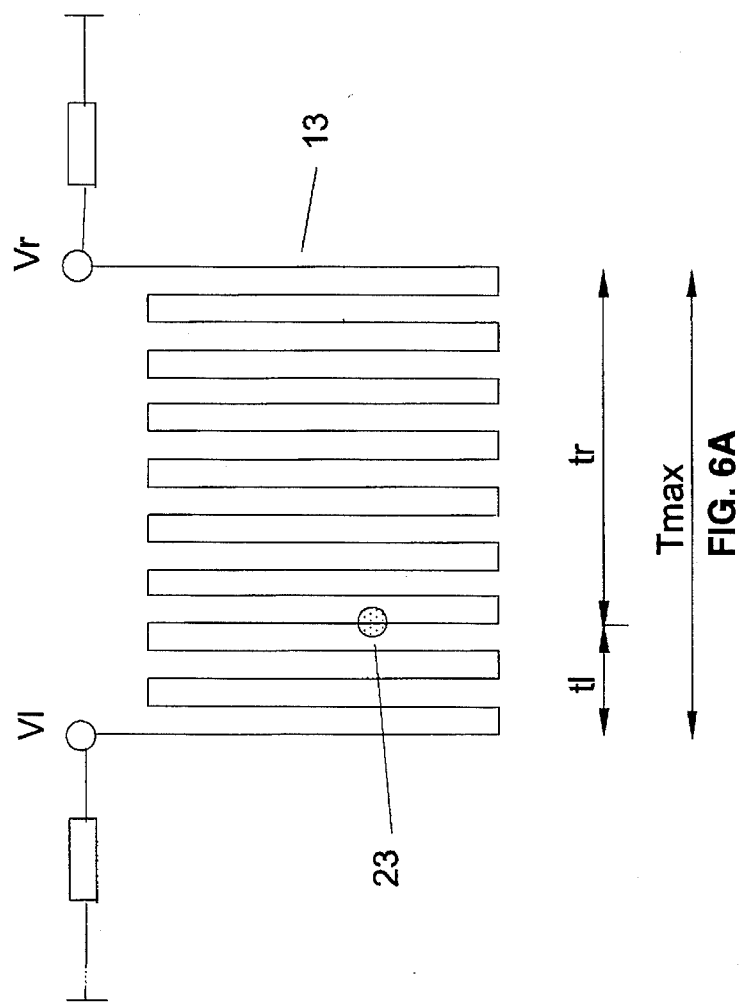
FIG. 6C
FIG. 6A
FIG. 6B

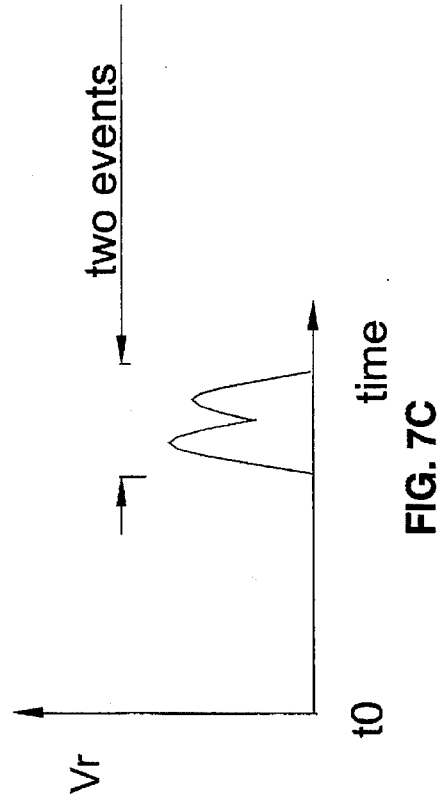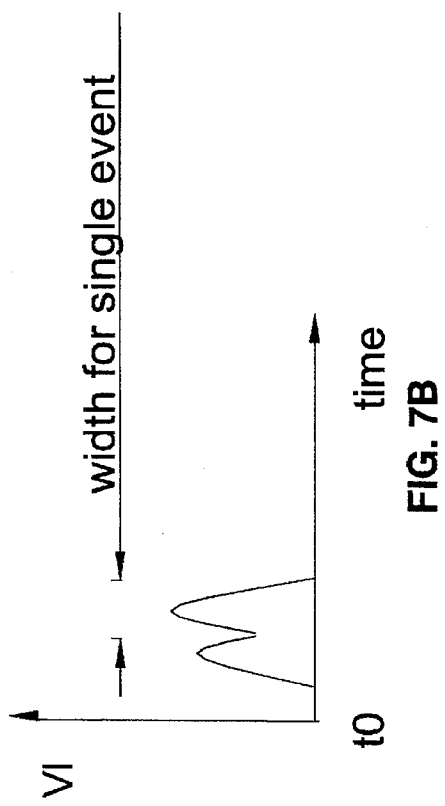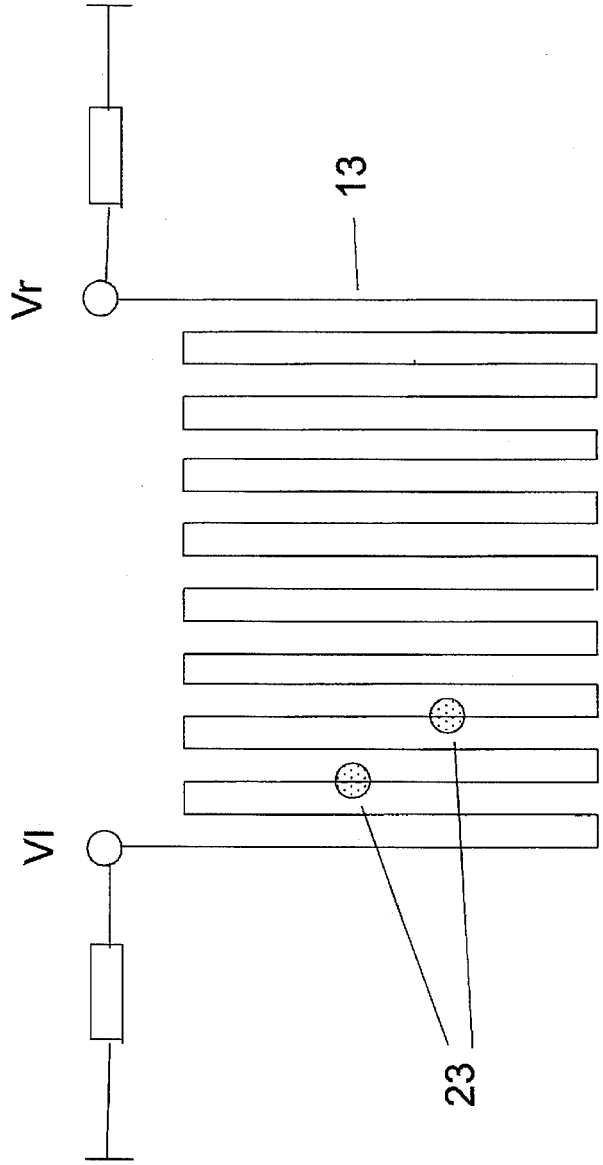

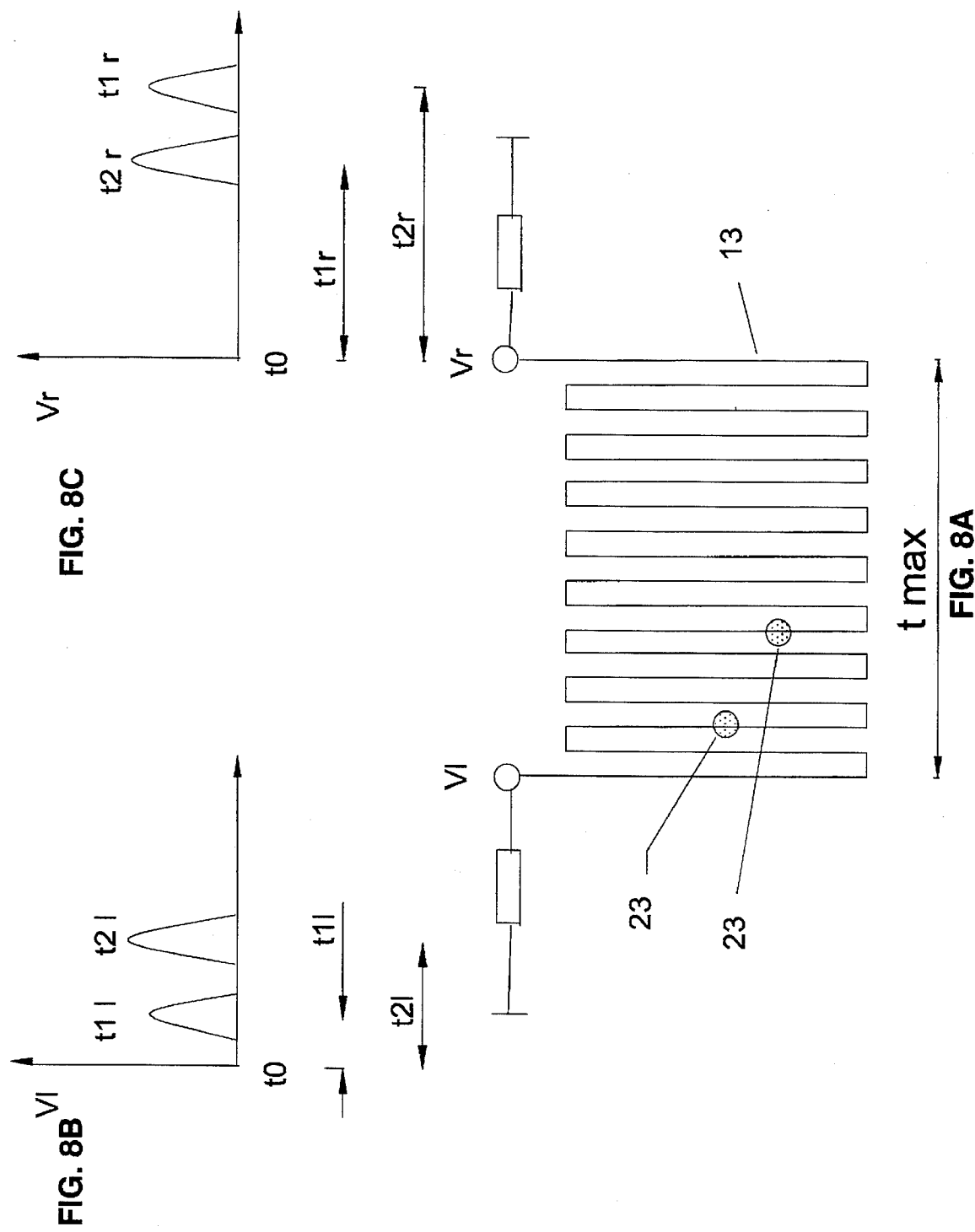

FAST TIMING POSITION SENSITIVE DETECTOR

BACKGROUND

1. Field of the Invention

The invention relates to an apparatus for determining the time-of-flight mass analysis of energetic atomic particles, such as ions or electrons, and more particularly, to an apparatus that, in addition to determining a precise time information, determines the positions of individual atomic particles.

2. Description of the Related Art

A number of devices have been utilized for measuring the masses of atoms, molecules, and molecular fragments. Among the most accurate devices for such measurements is the "time-of-flight" mass spectrometer, which measures the time required for positive ions to reach an ion detector. At equal energies, lighter ions travel through the spectrometer more quickly reaching the ion detector before heavier ions. The ion detector is connected to a device that measures the number of ions reaching the detector in a given time interval as well as the relative number of atoms as a function of the mass number.

Several disadvantages exist in prior art devices. The most severe of such disadvantages are insufficient timing accuracies and limited count rates. Furthermore, most ion detectors are not position sensitive. In the present invention, these shortcomings are eliminated by a a special waveguide or waveguide-like designs. The resulting timing accuracy and count rate are extremely accurate. In addition to the improved timing properties, the invention simultaneously achieves position information. This information can be used to determine the position of an individual atomic particle and/or allow the timing signal to correct slightly for each position on the detector surface. Therefore the present invention exhibits a significant improvement over prior art time-of-flight mass spectrometers.

For the foregoing reasons, there is a need for a fast timing position sensitive detector for determining the time-of-flight mass of atomic particles that includes multi-anode collectors located between the channel plates and the backplate or ion detector.

SUMMARY OF THE INVENTION

The present invention is directed to a fast timing position sensitive detector for atomic particles comprising a plurality of anodes located between one or more channel plates and a backplane electrode. The position sensitive electrodes may form a special waveguide together with the grid or grids and the conductive backplane. The waveguide may be either a microstrip, a triplate waveguide or a similar structure. This special design allow for accurate measurement of the time-of-flight and the lateral position of atomic particles, such as ions, electrons or photons. A position sensitive fast timing dectector having features of the present invention comprises one or more channel plates for detecting a substantially simultaneous impact of one or more atomic particles and amplifying the particles into an electron cloud upon impact with the channel plates, and an electron detector for registering a time of occurrence and a position of the electron cloud. The rear surface of the channel plates may comprise a plane at fixed or ground potential.

According to a preferred embodiment, the electron detector comprises a time and position sensitive detection device located behind the channel plates and a back plane electrode located behind the time and position sensitive detection device. The position sensitive detection device may be comprised of a meandric delay line which is parallel to the back plane electrode and configured to delay an atomic particle signal as a function of the position of the electron cloud behind the channel plates with a timing signal taken from at least one end of the delay line. The position sensitive detection device may be suspended in a vacuum above the backplate, or alternatively, the detection device may be fixed to the back plate by an insulating material, such as ceramic, glass, diamond or polyamide foil. The position sensitive detection device may be biased to either a fixed DC potential or a ground potential.

The back plane electrode may be comprised of a grid or a solid planar plate and may be connected to a reference potential or ground. Each meandric delay line may be connected to a ground potential by a second resistor. Each of the resistors exhibits a surge impedance approximately equivalent to a surge impedance of the meandric delay line. The surge impedance of the meandric delay line is determined by varying a distance between the meandric delay line and the back plane.

According to one embodiment, the meandric delay line may exhibit a wire arranged in a plurality of spaced parallel windings. The meandric delay line windings also may be formed into a variety of different planar configurations. In an alternative embodiment, the meandric delay line exhibits a plurality of concentric circular windings which yield a radial position information. The separation of concentric circles increases substantially proportional to the increasing radii of the circles so that an overall delay is substantially proportional to the radius. Another alternative embodiment includes a meandric delay line exhibiting fan-shaped windings having a plurality of substantially straight radially extending windings, each of which is inclined at an angle relative to adjacent windings so that a delay will be proportional to an azimuthal angle.

According to a further preferred embodiment, a two-dimensional anode may be constructed by locating a second meandric delay line exhibiting a plurality of windings between the first delay line also exhibiting a plurality of windings and the back plate in an interspersed fashion to permit a relatively narrow electron cloud to be simultaneously intercepted by the windings of both delay lines. Both meandric delay lines are configured to delay an atomic particle signal as a function of the position of the electron cloud behind the channel plates. The first delay line may be oriented perpendicularly relative to the second delay line, or according to an alternative embodiment, at an angle relative thereto. The first and second meandric delay lines may exhibit windings of any planar configuration, as described above. According to one embodiment of the two-dimensional anode, the first meandric delay line exhibits a wire arranged in a plurality of concentric circles and the second meandric delay line exhibits a wire arranged in a fan-shaped configuration as described above.

A grid (reference to ground or DC biased) may be placed between the meandric delay lines to minimize cross talk, forming a triplate waveguide and simultaneously generating a good timing signal. A second grid may also be placed between the channel plates and the first meandric delay line.

According to a further alternative embodiment, the time and position sensitive detection device comprises a backgammon-like structure above a conductive back plane, which forms a waveguide-like structure and a meandric delay line located above the backgammon-like structure. A meandric delay line may be arranged above the backgammon-like structure such that an additional waveguide-like structure is achieved. The position detector may further include a grid located above the delay line to obtain a timing signal.

A further alternative embodiment of the fast timing position sensitive detector includes a time and position sensitive detection device which comprises an oblique anode located behind a grid, wherein position information is obtained from the varying pulse width of the oblique anode signal and/or the delay between the oblique anode signal and that of the grid. A conductive electrode shields both the oblique anode and the grid, which are each DC biased to a reference potential. The oblique anode may be configured as a cone to obtain a radial position information. Alternatively, the oblique anode may comprise two orthogonal anodes inserted into one another to form a two dimensional position detector.

The fast timing detector may further include an ion electron converter exhibiting a surface consisting of a material which releases several electron for every ion which contacts the surface and accelerates these secondary electrons toward the channel plates. According to the preferred configuration, the converter surface is covered by Ba or Cs, or a compound including Ba or Cs. The ion electron converter surface may be a grid placed in front of the channel plates from which the secondary electrons are accelerated to the channel plate directly. Alternatively, the ion electron converter surface may by a separate surface from which the secondary electrons are accelerated and then guided to the front surface of a channel plate amplifier. According to this alternative configuration, the secondary electrons may be accelerated and guided to the front surface of the channel plate amplifier by electrostatic round lenses, magnetic round lenses, quadrupole lenses, electrostatic deflecting shields, magnetic deflecting shields, or superimposed electrostatic and magnetic fields.

These and other features, aspects, and advantages of the present invention will become better understood with regard to the following description, appended claims, and accompanying drawings.

BRIEF DESCRIPTION OF THE DRAWINGS

FIG. 1 shows a plan view of a position sensitive fast timing detector for atomic particles according to a first embodiment of the invention;

FIG. 2 shows a partial plan view of a meander and back plane electrode according to an alternative embodiment of the invention;

FIG. 4A shows a side view of a two dimensional fast timing position detector according to an alternative embodiment of the invention;

FIG. 4B shows a front plan view of the x-meander of the fast timing position detector shown in FIG. 4A;

FIG. 4C shows a front plan view of the y-meander of the fast timing position detector shown in FIG. 4A;

FIG. 6A shows a plan view of a single event electron cloud intersecting a meandric delay line;

FIG. 6B shows a pulse scheme for the left node of the meander shown in FIG. 6A;

FIG. 6C shows a pulse scheme for the right node of the meander shown in FIG. 6A;

FIG. 7A shows a plan view of a closely spaced double event electron cloud both intersecting a meandric delay line;

FIG. 7B shows a pulse scheme for the left node of the meander shown in FIG. 7A;

FIG. 7C shows a pulse scheme for the right node of the meander shown in FIG. 7A;

FIG. 8A shows a plan view of two laterally spaced electron clouds intersecting a meandric delay line;

FIG. 8B shows a pulse scheme for the left node of the meander shown in FIG. 8A;

FIG. 8C shows a pulse scheme for the right node of the meander shown in FIG. 8A;

DESCRIPTION OF THE INVENTION

Figure 3B:
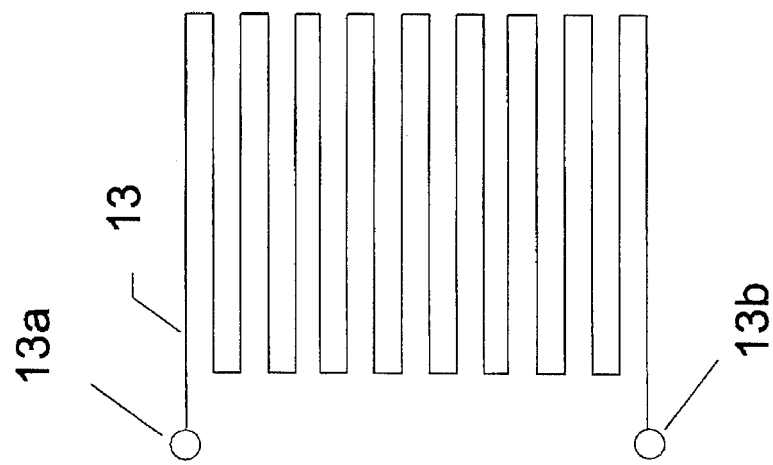
FIG. 3B shows a front plan view of the meander of the position detector shown in FIG. 3A.
Figure 3A:
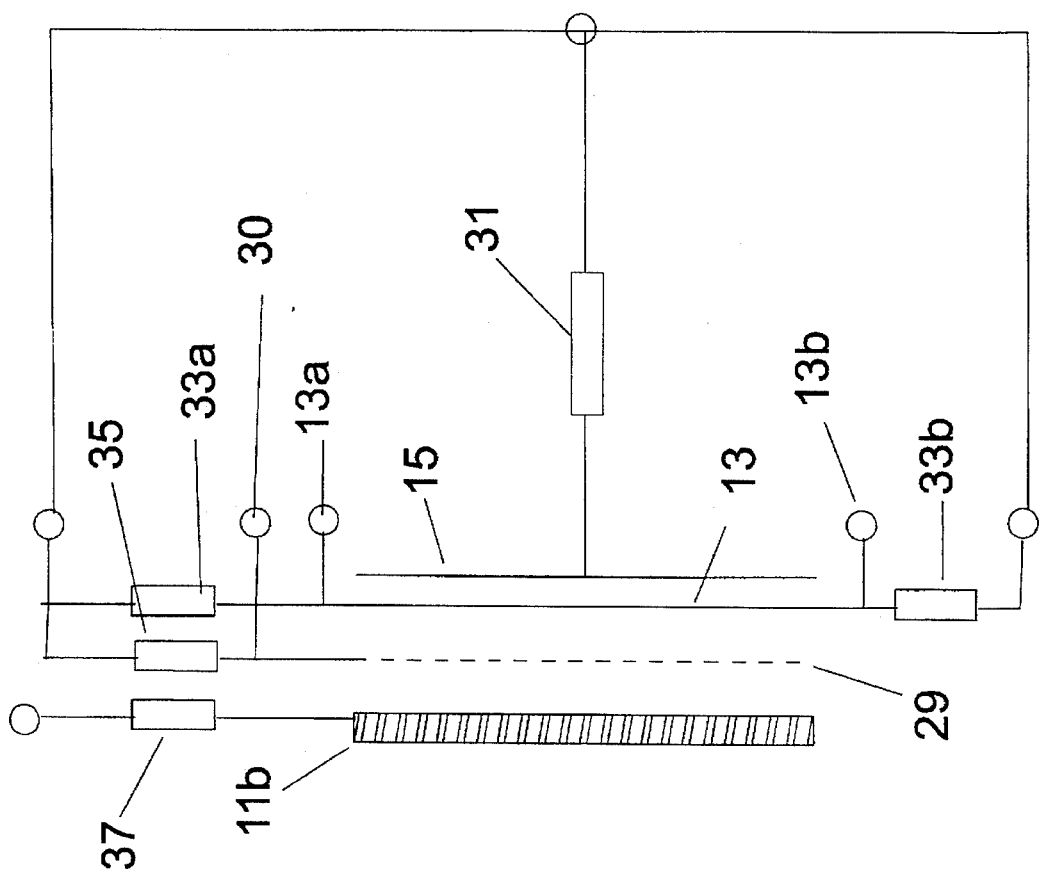
FIG. 3A shows a side view of a fast timing one dimensional position detector shown in FIG. 1.
Figure 5:
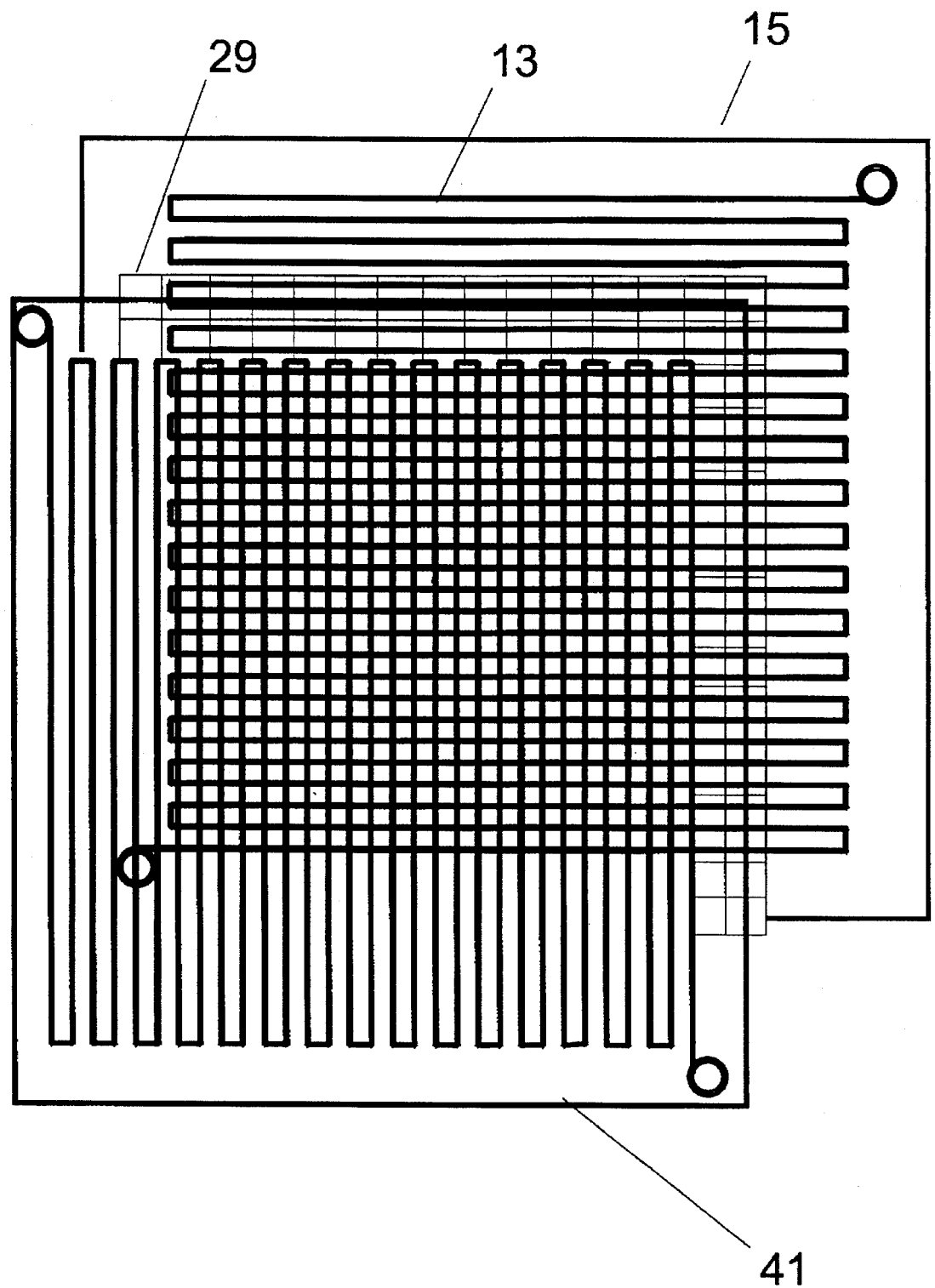
FIG. 5 shows a front plan view of the fast timing detector of FIG. 4A.

As shown in FIG. 1, a position sensitive fast timing detector according to a preferred embodiment of the invention comprises one or more channel plates 11a and 11b, an electron detector comprising, for instance, a time and position sensitive detection device such as a meandric delay line 13, and a back plate 15, which is at a reference potential. The electron detector registers the time of occurrence as well as the position of the electron cloud formed behind the channel plates. The position sensitive fast timing detector may further include an ion electron converter 17 for converting ions 19 to secondary electrons 21 which are accelerated to the channel plate 11a.

Each channel plate 11a and 11b preferably comprises a thin foil having a front surface onto which atomic particles to be analyzed are directed. The channel plate front surface detects a substantially simultaneous impact of one or more atomic particles in close proximity and amplifies the particles into an electron cloud which is released from the rear surface of the last channel plate. The rear surface of the channel plate 11b may be a plane connected to either a fixed or ground potential by a resistor 37. According to the preferred embodiment shown in FIG. 1, two parallel spaced apart channel plates 11a and 11b may be used.

The ion electron converter 17 having a surface consisting of a material which releases several electrons from each ion which strikes the surface. According to a preferred embodiment, the surface of the ion electron converter is covered by Barium (Ba), Cesium (Cs), or a compound including either Ba or Cs. According to a first embodiment, the ion electron converter comprises a grid located in front of the channel plates from which secondary electrons are accelerated directly to the channel plates. According to a second, alternative embodiment, the ion electron converter 17 exhibits a separate surface from which the secondary electrons 21 are accelerated and then guided to the front surface of a channel plate amplifier 11a. The secondary electrons are guided to the front surface of the channel plate amplifier 11a by a guiding means 25. The guiding means may be comprised of one or more lenses, such as electrostatic round lenses, magnetic round lenses, or quadrupole lenses. Alternatively, the guiding means may be comprised of magnetic, electrostatic or superimposed magnetic and electromagnetic deflecting fields.

When an ion 19 falls onto the surface of the converter 17, it releases secondary electrons 21 which are transported to the surface of a channel plate 11a and amplified such that a corresponding electron cloud 23 emerges from the back surface of the last channel plate 11b. The same result will occur if the ion impinges on the front surface of the channel plate 11a directly.

The atomic particle detector according to the first embodiment shown in FIG. 1 comprises a conductive meandric delay line 13 suspended in vacuum above a grounded conductive back plate 15. Alternatively, as shown in FIG. 2, the meandric delay line 13 may be fixed to the back plate 15 with an insulating material 27 exhibiting a higher dielectric constant than vacuum, such as ceramic, insulating glass, conductive glass, diamond or polyamide foil. In both cases a grid 29, from which a fast timing signal can be taken, may be placed additionally between the back surface of the channel plate and the delay line. The meandric delay line 13 and the backplane 15 are designed such that a high speed microstrip waveguide is formed. Together with the grid 29, a triplate line or similar structure is formed.

According to a preferred embodiment shown in FIG. 3B, the meandric delay line 13 exhibits a wire arranged in a plurality of parallel spaced windings configured to delay an atomic particle signal as a function of the electron cloud behind the channel plates with a timing signal taken from at least one of the delay out nodes 13a, and 13b located at the ends of the meander 13. The meander 13 acts together with the backplane 15 and/or grid 29 as a microstrip or triplate waveguide. The width and separation of the meander leads are chosen such that the surge impedance of the structure matches that of the external cable system. For a readout time of less than 5 ns and a position accuracy of +/– 1 mm, a 0.5 mm wide delay line is used. If a better position resolution is required, smaller and longer waveguides could be used that would require longer readout times.

The meandric delay line 13 is parallel to and may be located between 0.0005 and 0.5 mm from the back plate 15. In order to obtain an impedance of 50 ohms, the meandric delay line 13 is positioned approximately 0.2 mm above the grounded back plate 15. Preferably, UHV capable microstrip lines with vacuum insulation (preferably $E_r$ approximately 1.0) are used. Such a configuration has the advantage of a lower time-dispersion required for small pulse widths, corresponding to a wide frequency band.

The back plane electrode 15 may be comprised of either a grid or a solid planar plate, and is connected to a reference potential by a resistor 31. Each end of the meandric delay line 13 is connected to the ground or reference potential by resisters 33a and 33b. The resistors 31, 33a, and 33b exhibit a surge impedance approximately equivalent to the surge impedance of the meandric delay line 13, which is determined by varying the distance between the delay line 13 and the back plane electrode 15. The reference potential of the 15 meandric delay line and the back plane may be either a fixed DC potential or a ground potential. The grid 29 may also be connected to the reference potential by a resistor 35 which also exhibits a surge impedance approximately equivalent to the surge impedance of the meandric delay line 13.

FIG. 4A shows a two-dimensional anode readout used for the simultaneous time and position determination. The two dimensional configuration includes two meandric structures, an x-meander 13 and a y-meander 39 arranged at an angle, preferably perpendicularly, relative to one another. Each meander exhibits a plurality of parallel spaced windings configured to delay an atomic particle signal as a function of the position of the electron cloud behind the channel plates. The windings of the x-meander 13 are arranged in an interspersed fashion behind the windings of the y-meander 39 so that a relatively narrow electron cloud be simultaneously intercepted by the Windings of both meanders. A decoupling grid 29, connected to ground or reference potential by a resistor 35, is placed between the x-meander 13 and the y-meander 39 to reduce detrimental cross-talk between the first orthogonal y-meander 39, and the second triplate x-meander 13. A timing signal is taken from the timing out node 30 of the decoupling grid 29. A grounded back plate 15 is situated behind the triplate x-meander. A second grid 41 having a timing out node 42 may be placed between the channel plate 11b and the y-meander 39 to further improve the timing signal.

Each end of the x-meander 13 and the y-meander 39 is connected to a reference potential by resistors 33a, 33b and 43a, 43b, respectively. The resistors 33a, 33b, 43a, and 43b exhibit a surge impedance approximately equivalent to the surge impedance of the respective x-meander 13 or y-meander 39. Grids 29 and 41 may also be connected to the reference potential by resistors 35 and 45 which also exhibit a surge impedance approximately equivalent to the surge impedance of the respective meanders.

FIGS. 6A, 7A and 8A show charge clouds 23 intersecting a meandric delay line 13. FIG. 6A shows how the electron cloud 23 caused by a single ion impinges on the meander. FIGS. 6A, 6B and 6C illustrate the principle that the total transit time or maximum delay time $T_{Max}$ equals the sum of the transit time recorded at both ends of the meander ($T_{Max}=t_1+t_r$). FIGS. 7A–7C represents a scheme for distinguishing between two simultaneous impinging, closely spaced charge electron clouds 23 by measuring the pulse width of the meander signal. The distinction between one or more events is made by the obtained pulse width. FIGS. 8A–8C illustrate the result of two simultaneously impinging, but laterally separated ion hits along the meander. In this situation we find $t_{1l}+t_{1r}=t_{2l}+t_{2r}=t_{Max}$. The identification of the particular electron cloud is made by evaluating the individual times and pulse amplitudes, since longer travelling times on the meander cause signals of greater amplitude.

Figure 9:
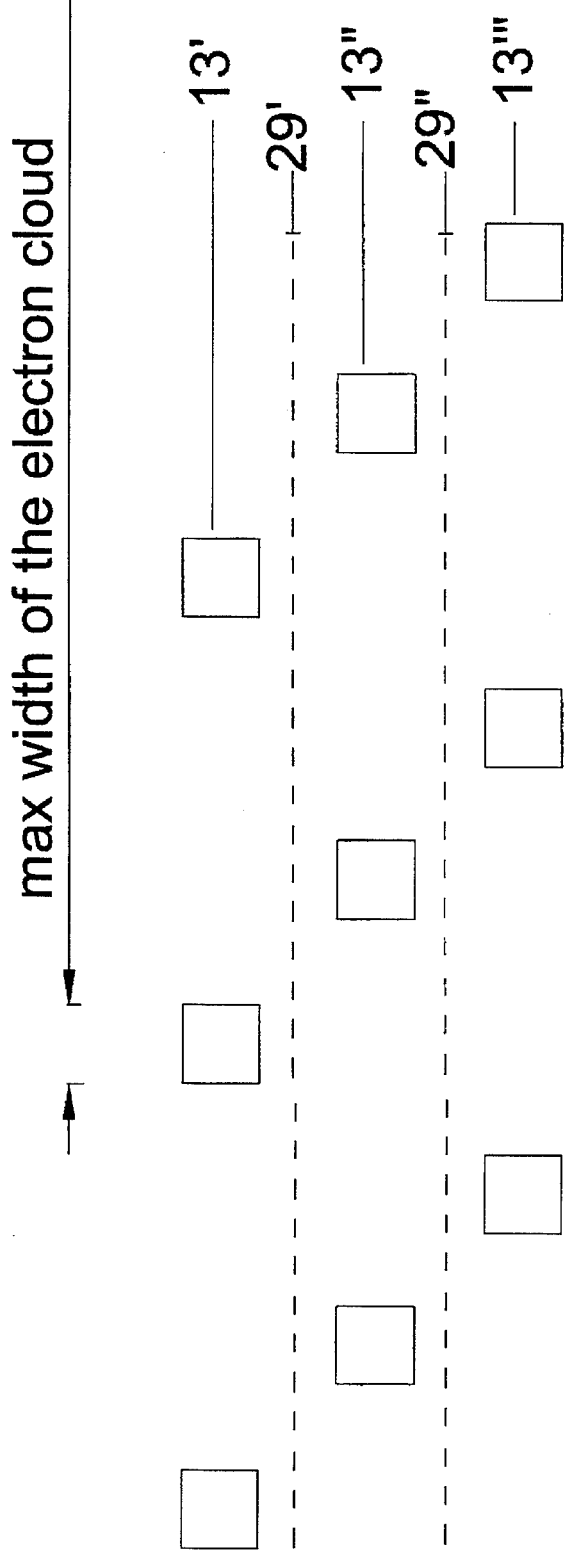
FIG. 9 shows a method of deducing instantaneous count rates.

FIG. 9 illustrates a method of detecting two or more simultaneously occurring but laterally separated electron clouds, which are recorded as counts on different "sparsified" delay lines 13', 13", and 13''', separated by grids 29' and 29".

Figure 10A:
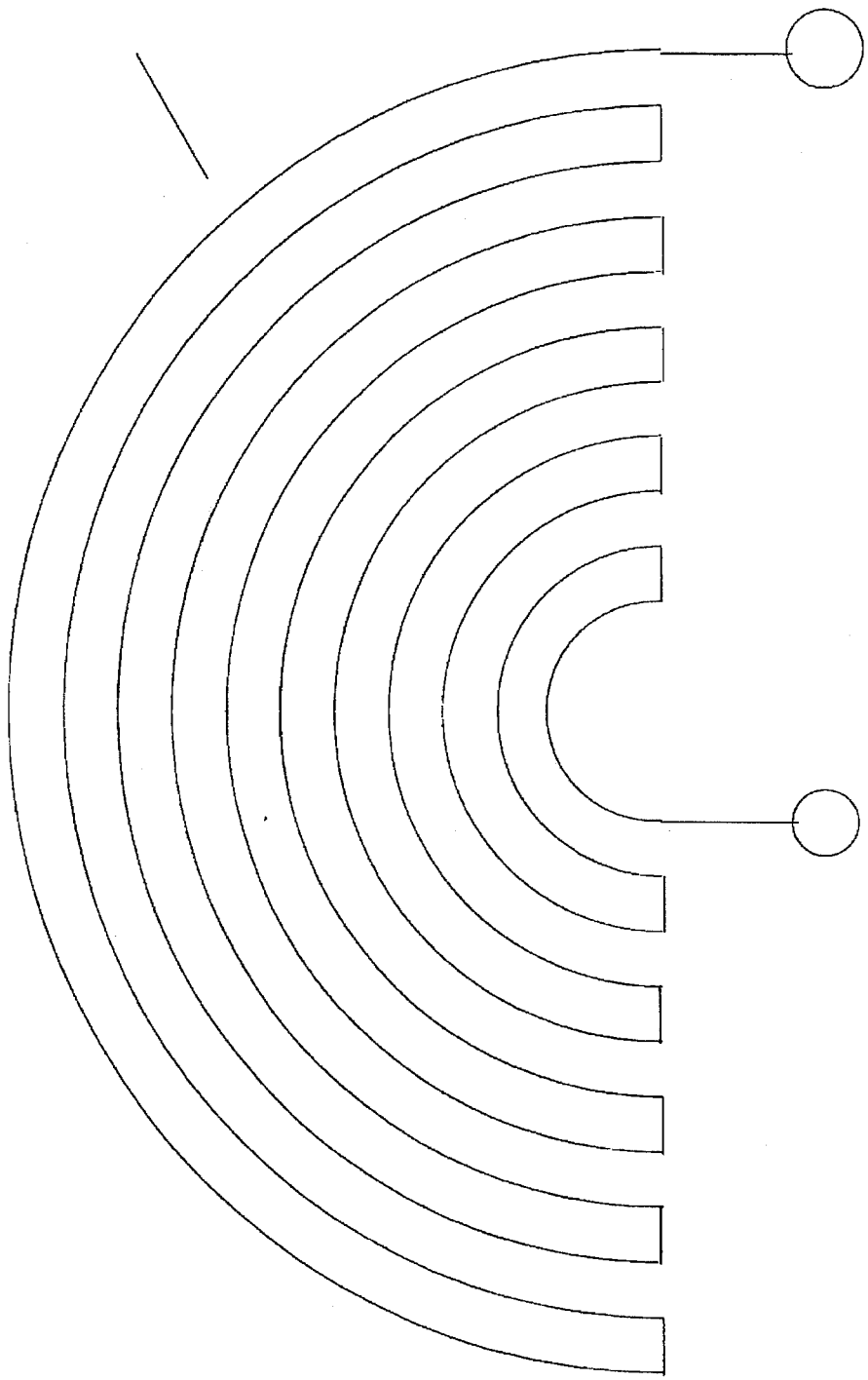
FIG. 10A shows a concentric meandric delay line according to an alternative embodiment of the invention.
Figure 10B:
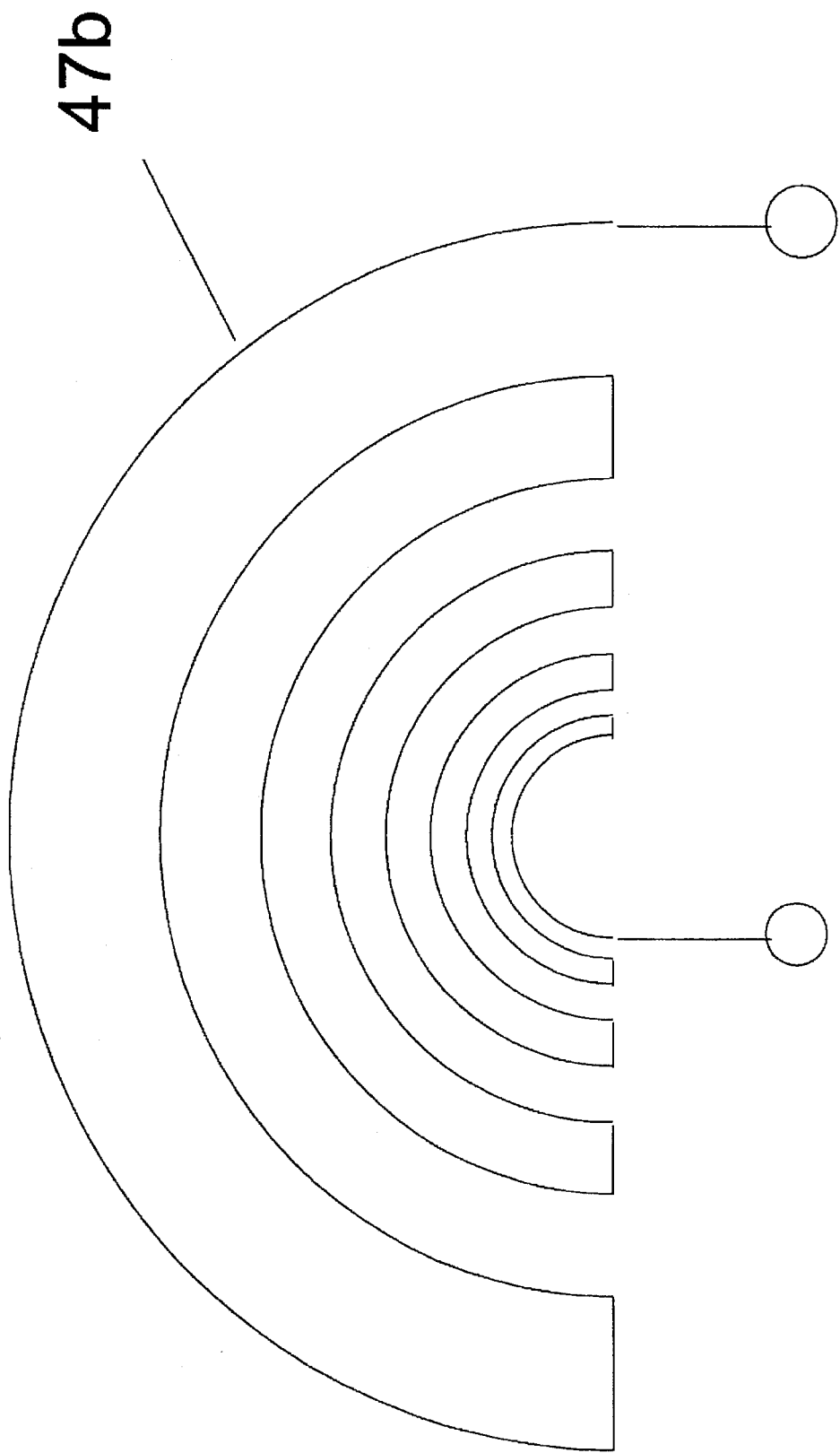
FIG. 10B shows a concentric meandric delay line according to a further alternative embodiment of the invention.
Figure 10C:
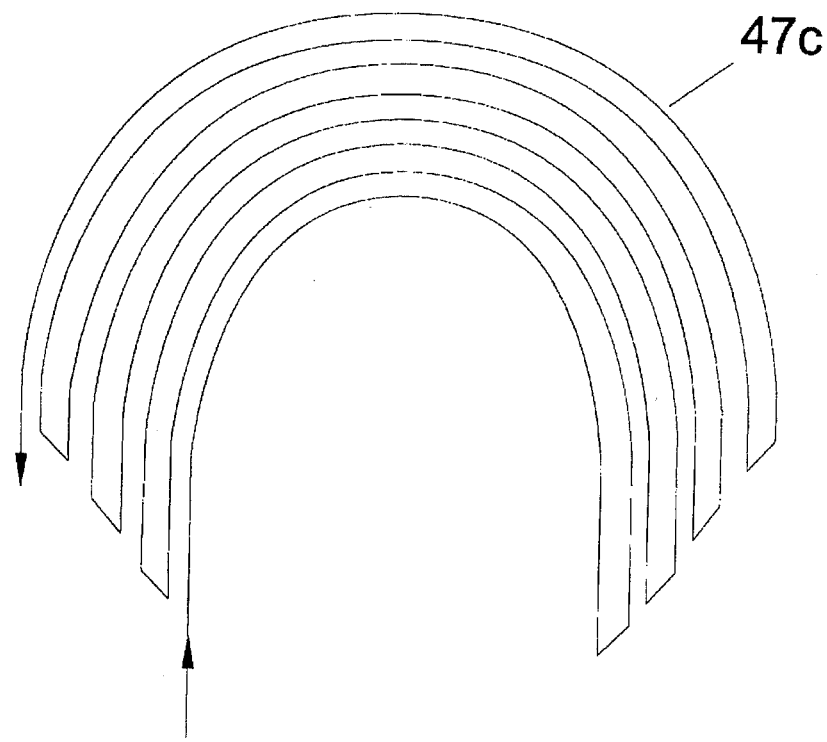
FIG. 10C shows a concentric meandric delay line according to another alternative embodiment of the invention.

FIG. 10A, 10B and 10C show three configurations of concentric meandric delay lines 47a, 47b and 47c. In all three cases the delay differences vary with the radial position of the electron cloud. The meandric delay line 47b shown in FIG. 10B exhibits concentric circular windings which increase substantially proportional to the increasing radii of the circles so that an overall delay is substantially proportional to the radius.

Figure 10D:
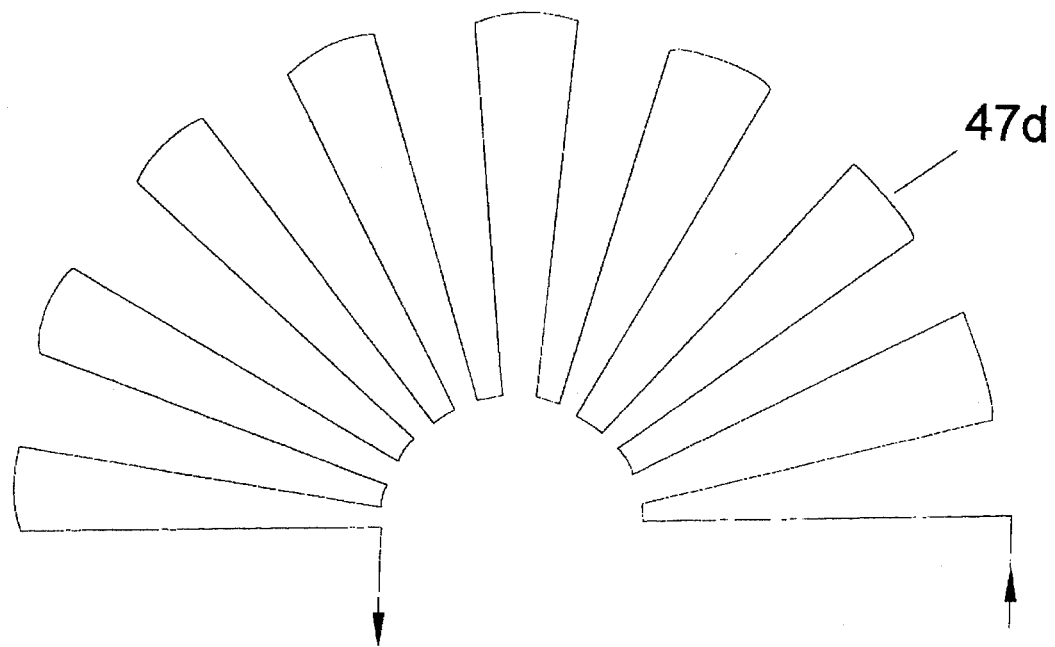
FIG. 10D shows a "fan-shaped" meandric delay line according to a further alternative embodiment of the invention.

FIG. 10D shows a "fan-shaped" meandric delay line 47d exhibiting a plurality of substantially straight, radially extending windings, each inclined at an angle relative to the adjacent winding so that the observed delay is proportional to the azimuthal angle.

Figure 11A:
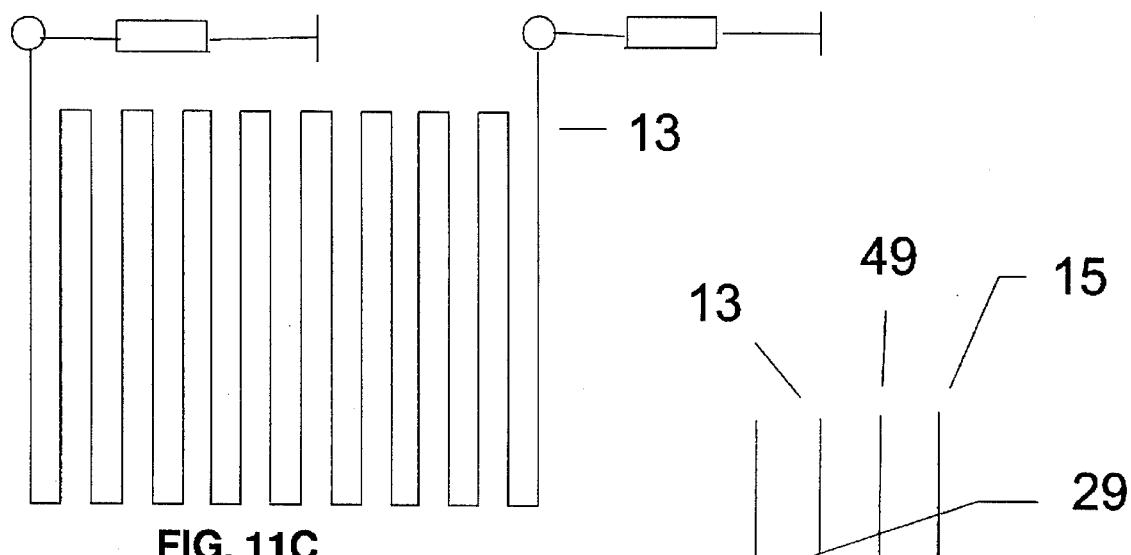
FIG. 11A shows an alternate embodiment of a position sensitive fast timing detector according to the invention.
Figure 11C:
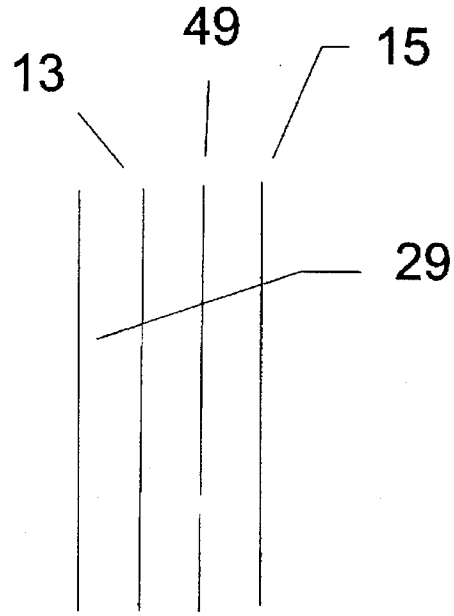
FIG. 11C shows a meandric delay line of the fast timing detector shown in FIG. 11A.
Figure 11B:
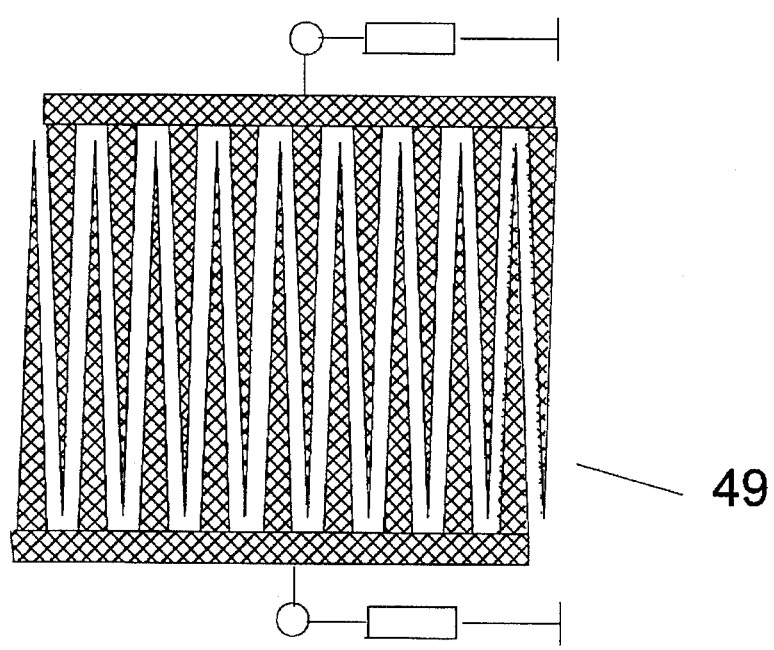
FIG. 11B shows a backgammon-like structure of the fast timing detector shown in FIG. 11A.

FIGS. 11A, 11B and 11C show a further alternative embodiment, wherein the time and position sensitive detection device comprises a backgammon-like structure 49 at reference potential, located above a back plane electrode 15, and a meandric delay line 13 located above the backgammon-like structure 49. The backgammon-like structure 49, meandric delay line 13, back plane electrode 15, and any additional anodes are all DC biased to a reference potential. The position detector may further include a grid 29 located above the delay line 13 to obtain a timing signal. The backgammon-like structure, together with the backplane, forms a microstrip waveguide with varying surge impedance. The meandric delay lines and the backgammon-like structure also form a waveguide-like structure. Where a grid is also used, it is arranged such that it is integrated into the waveguide-like structure to form a triplate waveguide-like structure.

Figure 12:
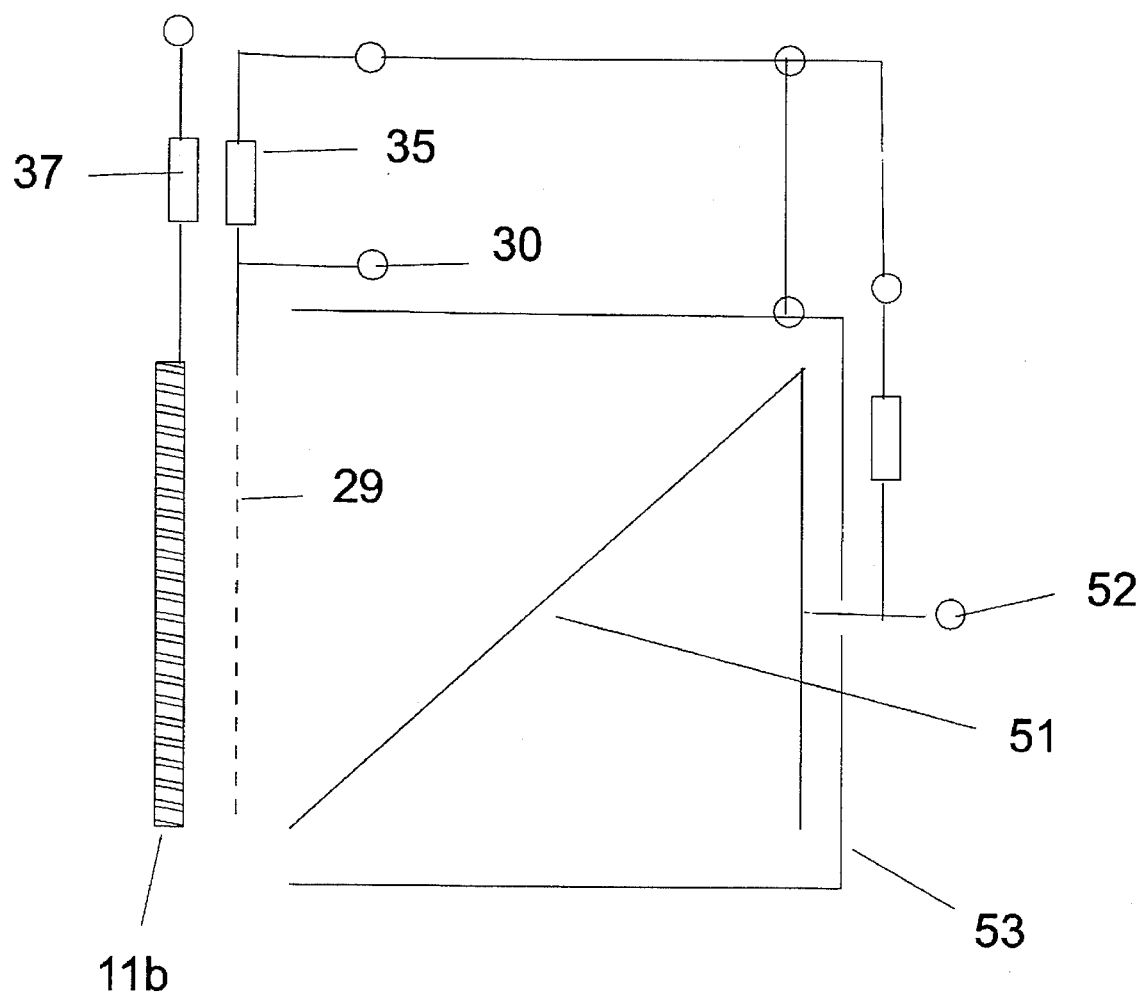
FIG. 12 shows a further embodiment of a position sensitive fast timing detector according to the invention.

FIGS. 12A, 12B and 12C show a further alternative embodiment of the fast timing position sensitive detector which includes a time and position sensitive detection device which comprises an oblique anode 51 located behind a grid 29, wherein position information is obtained from the varying pulse width on the oblique anode 51 signal and/or the delay between the oblique anode 51 signal at the position readout node 52 and the signal of the grid 29. A conductive electrode 53 shields both the oblique anode 51 and the grid 29, which are each DC biased to a reference potential. The oblique anode 51 may be configured as a cone to obtain a radial position information. Alternatively, the oblique anode 51 may comprise two orthogonal anodes inserted into one another to form a two dimensional position detector.

Although the present invention has been described in detail with reference to certain preferred embodiments, other embodiments are possible. Therefore, the spirit and scope of the appended claims should not be limited to the description of the preferred embodiments described herein.

We claim:

1. A position sensitive fast timing detector for atomic particles comprising:

a channel plate exhibiting a front surface for detecting a substantially simultaneous impact of one or more atomic particles in close proximity, said channel plate amplifying said one or more atomic particles into an electron cloud released from a rear surface of said channel plate; and a triplate waveguide electron detector for independently registering a time of occurrence and a position of the electron cloud formed behind the channel plate.

2. The fast timing detector of claim 1, wherein said one or more atomic particles are selected from a group consisting of ions, electrons and photons.

3. The fast timing position detector of claim 1, wherein said triplate waveguide electron detector comprises:

a time sensitive detection device located proximal to the rear surface of said channel plate;

a position sensitive detection device located proximal to a rear surface of said time sensitive detection device; and a back plane electrode located proximal to a rear surface of said position sensitive detection device.

4. The fast timing position detector of claim 3, wherein a space between the rear surface of the position sensitive detection device and the front surface of the back plane electrode is a vacuum.

5. The fast timing detector of claim 3, wherein said position sensitive detection device comprises a meandric delay line to delay an atomic particle signal as a function of the position of the electron cloud behind the channel plate with a timing signal taken from at least one end of the delay line; and wherein said delay line is parallel to said back plane electrode.

6. The fast timing detector of claim 5, wherein said back plane electrode is connected to a reference potential by a first resistor and wherein each end of the meandric delay line is connected to ground by a second resistor; said first and second resistors exhibiting a surge impedance approximately equivalent to a surge impedance of the meandric delay line; said delay line surge impedance being determined by varying a distance between said meandric delay line and the back plane.

7. The fast timing detector of claim 5, wherein the meandric delay line exhibits a wire arranged in a plurality of parallel spaced windings.

8. The fast timing detector of claim 5, wherein the meandric delay line exhibits a wire arranged in a plurality of concentric circles which yield a radial position information.

9. The fast timing detector of claim 4, wherein the separation of adjacent concentric circles increases substantially proportional to increasing radii of the circles so that an overall delay is substantially proportional to the radius.

10. The fast timing detector of claim 5, wherein the meandric delay line exhibits a wire arranged in a fan-shaped configuration having a plurality of substantially straight radially extending windings, each straight radially extending winding is inclined at an angle relative to adjacent windings so that a delay will be proportional to an azimuthal angle.

11. The fast timing detector of claim 3, wherein said position sensitive detection device comprises a first meandric delay line exhibiting a plurality of meander windings, and a second meandric delay line also exhibiting a plurality of meander windings, said first and second meandric delay lines both configured to delay an atomic particle signal as function of the position of the electron cloud behind the channel plate.

12. The fast timing detector of claim 11, wherein the windings of said second meandric delay line are arranged in an interspersed fashion behind the windings of said first meandric delay line so that a relatively narrow electron cloud cannot be simultaneously intercepted by the windings of both the first and second meandric delay lines.

13. The fast timing detector of claim 11, wherein said atomic particle detector further comprises at least one grid placed between said first meandric delay line and said second meandric delay line such that the windings of the first meandric delay line are not parallel to the windings of the second meandric delay line so that delays of the atomic particle signals allow a two-dimensional position information.

14. The fast timing detector of claim 11 or 13, wherein said first meandric delay line is oriented perpendicularly relative to said second meandric delay line.

15. The fast timing detector of claim 11 or 13, wherein said first meandric delay line and said second meandric delay line are oriented at an angle relative to each other.

16. The fast timing detector of claim 11 or 13, wherein said first meandric delay line exhibits a wire arranged in a plurality of concentric circles, and said second meandric delay line exhibits a wire arranged in a fan-shaped configuration having a plurality of substantially straight radially extending sections, each straight radially extending section is inclined at an angle relative to adjacent sections.

17. The fast timing detector of claim 13, wherein a timing signal is taken from the grid placed between the first and second meandric delay lines.

18. The fast timing detector of claim 3, wherein a space between the rear surface of said position sensitive detection device and a front surface of said back plane is filled by a material exhibiting a higher dielectric constant than vacuum.

19. The fast timing detector of claim 18, wherein the material is selected from a group consisting of ceramic, insulating glass, conductive glass, diamond or polyamide foil.

20. The fast timing position detector of claim 3, wherein the position sensitive detection device comprises a backgammon-like structure located above a front surface of the back plane, said backgammon-like structure at a reference potential, and a meandric delay line located above said backgammon-like structure.

21. The fast timing position detector of claim 20, wherein all electrodes are DC biased to reference potential.

22. The fast timing position detector of claim 3, wherein said time sensitive detection device comprises a grid to obtain a timing signal.

23. The fast timing position detector of claim 3, wherein the time sensitive detection device comprises a grid; and the position sensitive detection device comprises an oblique anode with a shield.

24. The fast timing position detector of claim 23, wherein said grid and said oblique anode are each DC biased to a reference potential.

25. The fast timing position detector of claim 23, wherein the oblique anode is a cone configured to obtain a radial position information.

26. The fast timing position detector of claim 23, wherein said oblique anode comprises two orthogonal oblique anodes inserted into one another to form a two dimensional position detector.

27. The fast timing detector of claim 3, wherein said position sensitive detection device exhibits a fixed DC-potential.

28. The fast timing detector of claim 3, wherein said position sensitive detection device exhibits a ground potential.

29. The fast timing detector of claim 3, wherein said back plane electrode is a solid planar plate.

30. The fast timing detector of claim 1, further comprising an ion electron converter having a surface from which secondary electrons are accelerated to the channel plate.

31. The fast timing detector of claim 30, wherein the ion electron converter surface consists of a material which releases many electrons for every ion.

32. The fast timing detector of claim 30, wherein in which the converter surface is covered by a metallic element selected from the group consisting of Cs and Ba.

33. The fast timing detector of claim 30, wherein in which the converter surface is covered by a compound including a metallic element selected from the group consisting of Cs and Ba.

34. The fast timing detector of claim 30, wherein the ion electron converter surface is a grid in front of the channel plate from which the secondary electrons are accelerated to the channel plate directly.

35. The fast timing detector of claim 30, wherein the ion electron converter surface is a separate surface from which the secondary electrons are accelerated and then guided to the front surface of a channel plate amplifier.

36. The fast timing detector of claim 35, wherein the secondary electrons are accelerated and then guided to the front surface of the channel plate amplifier by electrostatic round lenses.

37. The fast timing detector of claim 35, wherein the secondary electrons are accelerated and then guided to the front surface of the channel plate amplifier by magnetic round lenses.

38. The fast timing detector of claim 35, wherein the secondary electrons are accelerated and then guided to the front surface of the channel plate amplifier by quadrupole lenses.

39. The fast timing detector of claim 35, wherein the secondary electrons are accelerated and then guided to the front surface of the channel plate amplifier by electrostatic deflecting fields.

40. The fast timing detector of claim 35, wherein the secondary electrons are accelerated and then guided to the front surface of the channel plate amplifier by magnetic deflecting fields.

41. The fast timing detector of claim 25, wherein the secondary electrons are accelerated and then guided to the front surface of the channel plate amplifier by superimposed electrostatic and magnetic fields.

42. The fast timing detector of claim 1, wherein the rear surface of the channel plate is a plane at fixed potential.

43. A position sensitive fast timing detector for atomic particles comprising:
   a channel plate exhibiting a front surface for detecting a substantially simultaneous impact of one or more atomic particles in close proximity, said channel plate amplifying said one or more atomic particles into an electron cloud released from a rear surface of said channel plate; and
   an electron detector for registering a time of occurrence as well as a position of the electron cloud formed behind the channel plate, said electron detector comprising:
      a time and position sensitive detection device located proximal to the rear surface of said channel plate; and
      a back plane electrode comprising a grid located proximal to a rear surface of said position sensitive detection device.

44. A position sensitive fast timing detector for atomic particles comprising:
   a channel plate exhibiting a front surface for detecting a substantially simultaneous impact of one or more atomic particles in close proximity and a rear surface comprising a plane at ground potential, said channel plate amplifying said one or more atomic particles into an electron cloud released from said rear surface of said channel plate; and
   an electron detector for registering a time of occurrence as well as a position of the electron cloud formed behind the channel plate, said electron detector comprising:
      a time and position sensitive detection device located proximal to the rear surface of said channel plate; and
      a back plane electrode located proximal to a rear surface of said position sensitive detection device.

45. An electron detector for registering a time of occurrence as well as a position of an electron cloud formed behind a channel plate of a position sensitive fast timing detector for atomic particles, said electron detector comprising:

a time and position sensitive detection device located proximal to the rear surface of said channel plate;

a back plane electrode located proximal to a rear surface of said position sensitive detection device; and a vacuum situated between the rear surface of said time and position sensitive device and the front surface of the backplane.

* * * * *